United States Patent [19]

LaMarche

[11] Patent Number: 4,879,474
[45] Date of Patent: Nov. 7, 1989

[54] CONTACT-FREE OPERATING ELECTRONIC SWITCHGEAR

[75] Inventor: Jean-Luc LaMarche, Langenargen, Fed. Rep. of Germany

[73] Assignee: i f m Electronic GmbH, Fed. Rep. of Germany

[21] Appl. No.: 216,173

[22] Filed: Jul. 7, 1988

[30] Foreign Application Priority Data

Jul. 7, 1987 [DE] Fed. Rep. of Germany ....... 3722334

[51] Int. Cl.$^4$ ..................... H01H 35/00; G01N 27/00
[52] U.S. Cl. .................................. 307/116; 307/117; 307/308; 331/65; 324/207
[58] Field of Search ........................ 307/116, 308, 117; 323/326; 328/5; 331/65; 324/207, 236, 327, 208; 340/551, 600

[56] References Cited

U.S. PATENT DOCUMENTS

| 4,336,491 | 6/1982 | Buck et al. | 323/326 |
| 4,731,591 | 3/1988 | Weigand | 307/207 |

FOREIGN PATENT DOCUMENTS

| 0169582 | 1/1981 | European Pat. Off. . |
| 3004829 | 9/1981 | Fed. Rep. of Germany . |
| 3016821 | 11/1981 | Fed. Rep. of Germany . |

Primary Examiner—William M. Shoop, Jr.
Assistant Examiner—Sharon D. Logan
Attorney, Agent, or Firm—Browdy and Neimark

[57] ABSTRACT

A contact-free operating electronic switchgear, having an oscillator capable of being externally affected, a switching amplifier with at least two operating units disposed downstream of the oscillator, an electronic switch, which can be controlled by the oscillator via the switching amplifier, and a supply circuit for the provision of the supply voltage for the oscillator and for the switching amplifier, is shown and described. In electronic switchgear operating contact-free in accordance with the invention the maximum switching frequency is considerably increased in that a control circuit is provided between the two operating units of the switching amplifier and the oscillator and that the oscillator is controlled by means of the control circuit in such a way that the oscillator also oscillates in the affected state.

16 Claims, 2 Drawing Sheets

CONTACT-FREE OPERATING ELECTRONIC SWITCHGEAR

BACKGROUND OF THE INVENTION

1. Field of the Invention

The invention relates to a contact-free operating electronic switchgear, having an oscillator capable of being externally affected, a switching amplifier with at least two operating units disposed downstream of the oscillator, an electronic switch, e.g. a transistor, a thyristor or a triac, which can be controlled by the oscillator via the switching amplifier, and a supply circuit for the provision of the supply voltage for the oscillator and for the switching amplifier.

2. The Prior Art

Electronic switchgear of the type basically addressed herein is contact-free and has been increasingly used for approximately twenty years in place of electrical, mechanically activated switchgear with contacts, in particular in connection with electrical or electronic measurement, open or closed loop control circuits. This is true in particular for so-called proximity switches, i.e. for electronic switchgear which operates contact-free. An indication is given by means of such proximity switches whether an activating element, to which the corresponding proximity switch is sensitive, has come sufficiently close to the proximity switch. If an activating element, to which the corresponding proximity switch is sensitive, has come sufficiently close to the proximity switch, the electronic switch is reversed. In a switchgear acting as a closing element the non-conducting electronic switch now becomes conducting, while in a switchgear acting as an opener the conducting electronic switch now inhibits. (By means of a switch-gear of the type under discussion it is also possible to indicate whether a physical quantity of an actuation medium to which the switchgear is sensitive has reached a corresponding value.) The oscillator which be externally affected as an essential component of electronic switchgear.

In regard to the mode of affecting the oscillator, differentiation between inductive and capacitive control is made. In connection with an electronic, contact-free switchgear with inductive control of the oscillator, it is true for the oscillator, as long as a metallic part has not yet reached a preselected distance, that $K \times V = 1$, with $K$=feedback factor and $V$=amplification factor of the oscillator, i.e. the oscillator oscillates. When the respective metallic part has reached the pre-selected distance, the increasing damping of the oscillator leads to a reduction of the amplification factor $V$, so that $K \times V < 1$, i.e. the oscillator ceases to oscillate.

In connection with an electronic, contact-free switchgear with capacitive control of the oscillator, it is true for the oscillator, as long as an actuating body has not sufficiently increased the capacitance between an actuating electrode and a backplate electrode, i.e. has not reached a pre-selected distance, that $K \times V < 1$, i.e. the oscillator does not oscillate. When the actuating body has reached the pre-selected distance, the increasing capacitance between the actuating electrode and the backplate electrode leads to an increase in the feedback factor $K$, so that $K \times V = 1$, i.e. the oscillator begins to oscillate. In both embodiments, inductive proximity switch and capacitive proximity switch, the electronic switch, e.g. a transistor, a thyristor or a triac, is controlled depending on the different sides of the oscillator.

In the beginning electronic contact-free switchgear was subject to a number of problems, in comparison with electrical mechanically actuated switchgear, namely among others "Provision of a Supply Voltage for the Oscillator and the Switching Amplifier", "Design of the Oscillator", "Resistance to Short Circuits" and "Activating Pulse Prevention". Addressing these problems and their solutions (as well as other problems and their solutions relating to electronic contact-free switchgear) are, for example, German Non-examined or Examined Published Applications or Patent Nos. 19 51 137, 19 66 178, 19 66 213, 20 36 840, 21 27 956, 22 03 039, 22 03 040, 22 03 906, 23 30 233, 23 31 732, 23 56 490, 26 13 423, 26 16 265, 26 16 773, 26 28 427, 27 11 877, 27 44 785, 29 43 911, 30 04 829, 30 38 102, 30 38 141, 30 38 692, 31 20 884, 32 05 737, 32 09 673, 32 14 836, 32 38 396, 33 20 975, 33 26 440, 33 27 328, 33 27 329, 34 20 236, 34 27 498, 35 19 714, 35 29 827, 36 05 199, 36 05 885 and 36 38 409.

In connection with electronic switchgear, which can be connected via an external conductor with one terminal of a supply voltage source and only via another external conductor with a connection of a consumer, the provision of the supply voltage or supply current for the presence indicator and for the switching amplifier is not without problems, because the supply voltage or the supply current must be provided in the conducting state as well as in the inhibited state of the switchgear.

It is of no consequence whether the provision of a supply voltage or the provision of a supply current is addressed. Here, provision represents derivation from the voltage drop occurring at the switchgear, or from the operating current conducted via the switchgear (conducting state), or from the operating voltage present at the switchgear or from the residual current flowing across the switchgear (inhibited state). Therefore it is of no consequence whether the provision of a supply voltage or a supply current is addressed, because the oscillator and the switching amplifier of course require a supply voltage and a supply current.

Based on its operation as switchgear, practically no voltage drop should occur in the switchgear herein discussed in the conductive state and practically no residual current should flow in the inhibited state. However since, if no voltage drop is allowed to occur in the conductive state in switchgear with only two external conductors, no supply voltage for the oscillator and the switching amplifier could be obtained and, if no residual current is allowed to flow in the inhibited state, no supply current could be obtained, it is true for all electronic switchgear with only two external conductors that in the conductive state a voltage drop occurs and in the inhibited state a residual current flows.

It follows from what has been stated above that the voltage drop and the residual current should be as small as possible, even though in electronic switchgear with only two external conductors a voltage drop occurs in the conductive state and a residual current flows in the inhibited state in a way which is unintentional but necessary for the operation.

In the beginning it was stated that, among others, a switching amplifier, placed downstream from the oscillator, and an electronic switch are associated with the electronic switchgear on which the invention is based, and that the electronic switch can be controlled via the switching amplifier by the oscillator. The term switching amplifier is to be understood in a general way and encompasses the entire circuit between the signal output of the oscillator and the control input of the electronic switch, thus the entire signal transmission path between the oscillator and the electronic switch. In the electronic switchgear on which the invention is based (see, for example, German Patent No. DE-PS 30 04 829) the oscillator can be externally affected, i.e. damped by a metal part and the electronic switch is controlled depending on whether the oscillator oscillates or not. In practice the evaluation of the oscillating behavior of the oscillator is performed by a demodulator (first operating unit of the switching amplifier) and by a Schmitt trigger (second operating unit of the switching amplifier). The demodulator changes the oscillator voltage, i.e. a signal A.C. voltage, to an analog signal D.C. voltage and the Schmitt trigger changes a signal D.C. voltage which is analogous to the oscillator voltage to a digital output signal at its output with which, if required via a further operating unit of the switching amplifier or via a plurality of further operating units of the switching amplifier, the electronic switch is controlled. If the signal D.C. voltage at the signal input of the Schmitt trigger is above a comparison voltage applied to a comparison input, the output signal logically is, for example, 1, if the signal voltage lies below the comparison voltage, the output signal logically is 0.

Oscillators require a certain run-up time in order to pass from the non-oscillating state to the oscillating state. This run-up time directly determines the maximum switching frequency of an electronic switchgear having an oscillator which can be affected in the manner described. The minimum time intervall between two actuation events of the oscillator must not be smaller than the run-up time of the oscillator; if the time intervall between two actuation events of the oscillator is smaller than the run-up time of the oscillator, the oscillator remains in the nonoscillating state.

Electronic switchgear of the type on which the invention is based is also used for counting tasks, so that the maximum switching frequency of such an electronic switchgear is of considerable importance.

SUMMARY OF THE INVENTION

It is therefore an object of the invention to recite electronic switchgear of the type discussed having a considerably higher switching frequency than the electronic switchgear on which the invention is based.

The electronic switchgear by means of which the object previously derived and described in detail has been attained is first and most generally characterized in that a control circuit is provided between the two operating units of the switching amplifier and the oscillator and that by means of the control circuit the oscillator is affected in such a way that it also oscillates in the affected state. Thus, while in the state of the art the oscillator does not oscillate in the affected state, i.e. if it is damped by a metal part, in the electronic switchgear according to the invention the oscillation of the oscillator is maintained during the affected state by means of the control circuit. The result of this is that the oscillator does not need to run up again between two actuation events, thus the run-up time does not influence the maximum switching frequency of the electronic switchgear in accordance with the invention. There are a number of different possibilities to realize the general idea of the invention previously described and to design and improve the electronic switching gear of the invention which is to be described below my way of example.

Basically it could be imagined to regulate the oscillator voltage in the electronic switchgear according to the invention, i.e. to assure by means of a control circuit expanded into a regulating circuit that the oscillator voltage remains the same in the non-affected state of the oscillator as in the affected state of the oscillator. It would then be necessary to derive from a correcting variable required for such regulation whether the oscillator is affected or not affected.

However, the possibility for realizing the teaching of the invention described above has the disadvantage that a relatively large amount of energy must be supplied to the oscillator in the affected state, i.e. a large power supply is required for the oscillator. But a large power supply for the oscillator results in an undesirably large voltage drop and/or an undesirably large residual current in an electronic switchgear with only two external conductors. Advantageously the control circuit between the two operating units of the switching amplifier and the oscillator in the electronic switchgear according to the invention is designed such that by its influence on the oscillator the signal D.C. voltage between the two operating units of the switching amplifier still has differentiated values which can be evaluated.

As known from the state of the art, it is also recommended with the electronic switchgear according to the invention to provide the first operating unit of the switching amplifier as a demodulator, the demodulator having a reference voltage source, a differential amplifier and a demodulator condenser connected directly or indirectly to the signal output of the differential amplifier. Furthermore it is then possible, again as known from the state of the art, for the demodulator to have a switching transistor, a load resistor and a constant current network and to charge the demodulator condenser with a constant charge current via the constant current network and to discharge it with a constant charge current. However, it is also possible to connect to the signal output ofo the differential amplifier a constant current charge generator and a constant current discharge generator and to charge the demodulator condenser with a constant charge current via the constant current charge generator and to discharge it with a constant discharge current via the constant current discharge generator.

In the electronic switchgear according to the invention the second operating unit of the switching amplifier is preferably in the form of a Schmitt trigger, as already realized in the state of the art, the Schmitt trigger having two comparison inputs, a control input and a signal output and the control input of the Schmitt trigger being connected to the demodulator condenser.

BRIEF DESCRIPTION OF THE DRAWINGS

The invention is described in detail below by means of the drawings showing only one exemplary embodiment, in which.

DETAILED DESCRIPTION OF A PREFERRED EMBODIMENT

Figure 1:
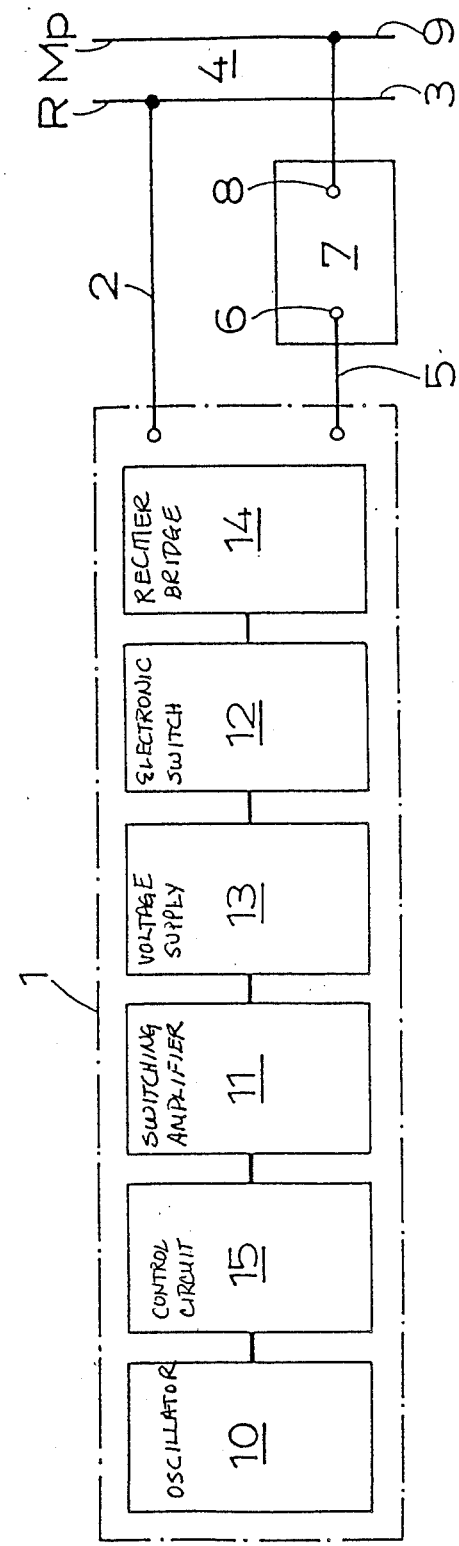
FIG. 1 is a block circuit diagram of contact-free operating electronic switchgear.

The electronic switchgear 1, shown in FIG. 1 by means of a block circuit diagram, operates contact-free, i.e. it reacts to, for example, an approaching metallic element, not shown and is connected via an external conductor 2 with a terminal 3 of an operating voltage source 4 and via another external conductor 5 to a connector 6 of a consumer 7, the other connector 8 of the consumer 7 being connected to the other terminal 9 of the operating voltage source 4. In other words, the switchgear 1 shown is connected in a known manner via a total of only two external conductors 2, 5 to the operating voltage source 4 on the one hand and, on the other, to the consumer 7.

As shown in FIG. 1, the switchgear 1 consists in its basic structure of an oscillator 10 which can be externally affected, a switching amplifier 11 having at least two operating units and placed downstream of the oscillator 10, an electronic switch 12, for example a thyristor, controllable by the oscillator 10 via the switching amplifier 11, and a supply circuit 13 for the provision of the supply voltage for the oscillator 10 and the switching amplifier 11. Furthermore, a rectifier bridge 14 is provided at the input because the operating voltage source 4 is an AC voltage source.

Figure 2:
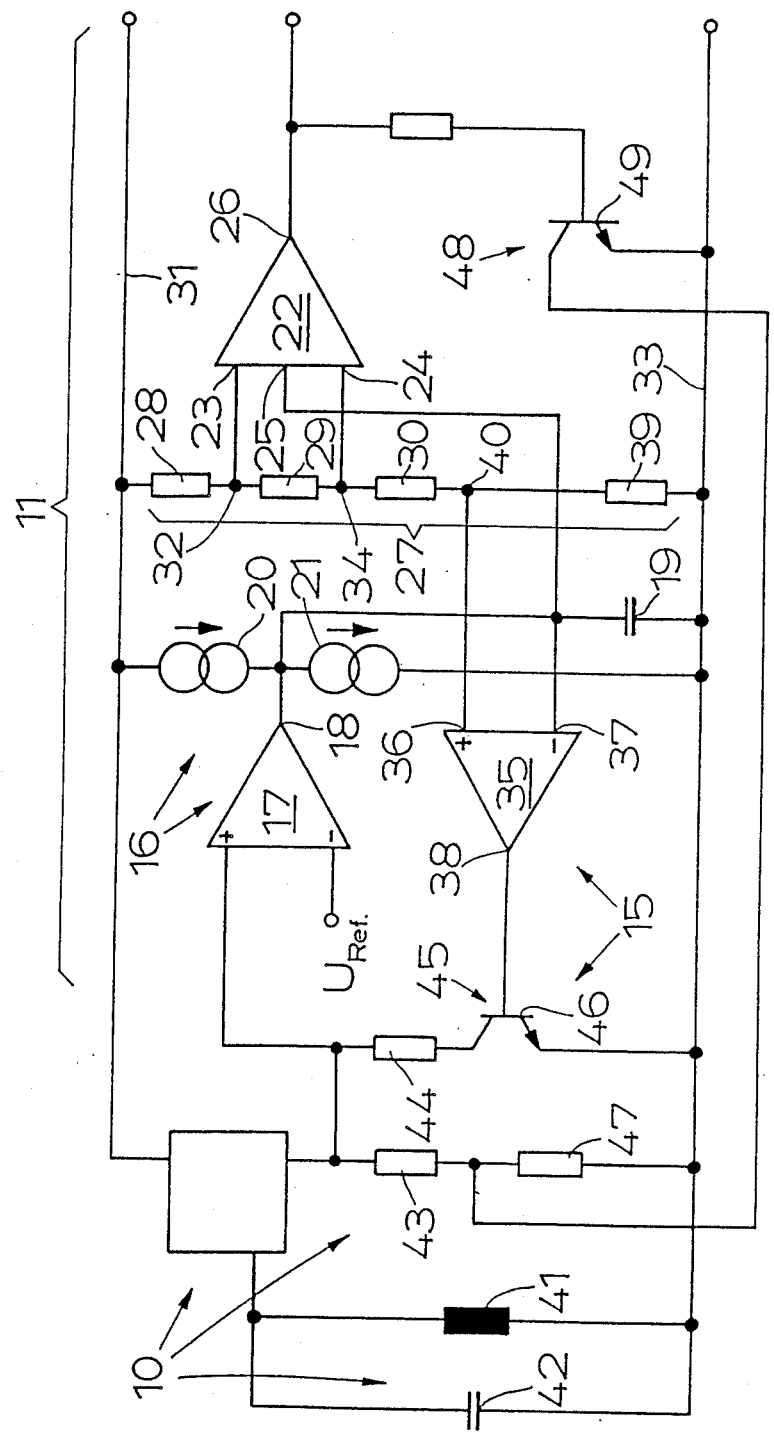
FIG. 2 is a simplified circuit diagram of a part of the electronic switchgear in accordance with the invention, showing the oscillator, the first operating unit of the switching amplifier, the second operating unit of the switching amplifier and the control circuit provided in accordance with the invention between the two operating units of the switching amplifier and the oscillator.

As shown in FIG. 2, a control circuit 15 is provided between the two operating units of the switching amplifier 11 and the oscillator 10 and by means of the control circuit 15 the oscillator 10 is affected in such a way that the oscillator 10 also oscillates in the affected state. Thus, while in the state of the art the oscillator 10 does not oscillate in the affected state, i.e. if it is damped by a metal part, in the electronic switchgear 1 according to the invention the oscillation of the oscillator 10 is maintained during the affected state by means of the control circuit 15. The result of this is that the oscillator 10 does not need to run up again between tow actuation events, thus the run-up time does not influence the maximum switching freuqency of the electronic switchgear 1 in accordance with the invention.

In the exemplary embodiment shown in FIG. 2 the first operating unit of the switching amplifier 11 is in the form of a demodulator 16, the demodulator 16 having a reference voltage source, not shown in detail, a differential amplifier 17, a demodulator condenser 19 connected to the signal output 18 of the differential amplifier 17, a constant current charge generator 20 connected to the signal output 18 of the differential amplifier 17 and a constant current discharge generator 21 connected to the signal output 18 of the differential amplifier 17. The demodulator condenser 19 is charge with a constant charge current via the constant current charge generator 20 and is discharged with a constant discharge current via the constant current discharge generator 21. Preferably the constant charge current is greater, in particular by a factor of 2 of 3, than the constant discharge current. Particular reference is made to German Patent No. DE-PS 30 04 829, in particular to column 4, lines 17 et. seq.; the contents of the disclosure of German Patent No. DE-PS 30 04 829 are hereby specifically incorporated by reference and made part of the disclosure in relation to and in connection with the electronic switchgear according to the invention.

As further shown in FIG. 2, the second operating unit of the switching amplifier 11 is in the form of a Schmitt trigger 22, the Schmitt trigger 22 having two comparison inputs 23, 24, a control input 25 and a signal output 26, and the control input 25 of the Schmitt trigger 22 being connected to the demodulator condenser 19. Furthermore a voltage divider 27 is provided, having three voltage divider resistors 28, 29, 30 and being connected to the supply voltage. A comparison input 23 of the Schmitt trigger 22 is connected to the connecting point 32 of the voltage divider resistor 28, 29 located near the positive terminal 31 of the supply voltage, while the other comparison input 24 of the Schmitt trigger 22 is connected to the connecting point 34 of the voltage divider resistors 28, 29 nearest the negative terminal 33 of the supply voltage.

In the exemplary embodiment shown, the control circuit 15 has an analog amplifier 35 with a reference input 36, a control input 37 and a control output 38. The reference input 36 is connected to a reference voltage, the control input 37 to the demodulator condenser 19 and the control output 38 to the oscillator 10.

Furthermore, in the exemplary embodiment shown in FIG. 2 the voltage divider 27 has a fourth voltage divider resistor 39 and is connected via the fourth voltage divider resistor 39 to the negative terminal 33 of the supply voltage. The reference input 36 of the analog amplifier 35 of the control circuit 15 is connected to the connecting point 40 between the third voltage divider resistor 30 and the fourth voltage divider resistor 39. FIG. 2 only shows, and this in a very simplified form, the oscillator 10, the switching amplifier 11 with the two operating units, demodulator 16 and Schmitt trigger 22, and the control circuit 15 of the electronic switchgear 1 shown in FIG. 1. In particular with respect to the oscillator 10, no details can be seen in FIG. 2, in particular it cannot be seen from FIG. 2 that the oscillator 10 has one or more oscillator transistors. As a part of the oscillator 10 are only shown an oscillating circuit coil 41, an oscillating circuit condenser 42 and an emitter resistor 43 located in the emitter circuit of the oscillator transistor, not further shown. In this exemplary embodiment the teaching of the invention, according to which the oscillator 10 is acted on by the control circuit 15 such that the oscillator 10 also oscillates in the affected state, is realized in that, by means of the control circuit 15, a control resistor 44 can be switched in parallel with the emitter resistor 43 of the oscillator transistor. This is accomplished in that the control circuit 15 has control transistor 45, the base 46 of the control transistor 45 is connected to the control output 38 of the analog amplifier 35 and the control resistor 44 can be switched in parallel with the emitter resistor 43 of the oscillator transistor in a more or less effective manner by means of the collector emitter path of the control transistor 45. By "more or less effective" is meant that the current flowing via the control resistor 44 and therefore the influence on the amplifying factor of the oscillator 10 depends on the analog amplifier 35, i.e. it depends on the reference voltage at the reference input 36 of the analog amplifier 35 and on the signal D.C. voltage at the control input 37 of the analog amplifier 35, i.e. on the signal D.C. voltage at the demodulator condenser 19.

Furthermore FIG. 2 shows a preferred embodiment of the electronic switchgear shown in FIG. 1 to the extent that a hysteresis resistor 47 and a hysteresis transistor 48 are provided. The hysteresis resistor 47 is in series with the emitter resistor 41 of the oscillator transistor. The base 49 of the hysteresis transistor 48 is connected to the signal output 26 of the Schmitt trigger 22 and the collector emitter path of the hysteresis transistor 48 is switched parallel with the hysteresis resistor 47. For details of this reference is made to German Patent No. DE-PS 19 66 178; the contents of the disclosure of German Patent No. DE-PS 19 66 178 are hereby also incorporated by reference with respect to the electronic switchgear 1 according to the invention.

The exemplary embodiment described above has been given by way of example only and other variants and improvements are possible within the scope of the invention.

I claim:

1. A contact-free operating electronic switchgear, comprising an oscillator capable of being externally affected, a switching amplifier having at least two operating units disposed downstream of the oscillator, an electronic switch which can be controlled by the oscillator via the switching amplifier, a supply circuit for the provision of a supply voltage for the oscillator and for the switching amplifier, and a control circuit between the two operating units of the switching amplifier and the oscillator, wherein the control circuit controls the oscillator such that the oscillator also oscillates when it is externally affected.

2. An electronic switchgear in accordance with claim 1, wherein the first operating unit of the switching amplifier comprises a demodulator.

3. An electronic switchgear in accordance with claim 2, wherein the demodulator comprises a reference voltage source, a differential amplifier and a demodulator condenser connected directly or indirectly to a signal output of the differential amplifier.

4. An electronic switchgear in accordance with claim 3, wherein the demodulator further comprises a switching transistor, a load resistor and a constant current network and the demodulator condenser is charged with a constant charge current via the constant current network and is discharged with a constant charge current.

5. An electronic switchgear in accordance with claim 3, further comprising a constant charge-current generator and a constant discharge current generator connected to a signal output of the differential amplifier and the demodulator condenser is charged with a constant charge current from the constant charge-current generator and is discharged with a constant discharge current from the constant discharge-current generator.

6. An electronic switchgear in accordance with claim 4, wherein the constant charge current is greater, preferably by a factor of 2 to 3, than the constant discharge current.

7. An electronic switchgear in accordance with claim 5, wherein the constant charge current is greater, preferably by a factor of 2 to 3, than the constant discharge current.

8. An electronic switchgear in accordance with claim 3, wherein the second operating unit of the switching amplifier comprises a Schmitt trigger.

9. An electronic switchgear in accordance with claim 8, wherein the Schmitt trigger has two comparison inputs, a control input and a signal output and the control output of the Schmitt trigger is connected with the demodulation condenser.

10. An electronic switchgear in accordance with claim 9, further comprising a voltage divider connected to the supply voltage and having three voltage divider resistors and two connecting points, one of said connecting points being located near a positive terminal of the supply voltage and the other of said connecting points being located near a negative terminal of the supply voltage, and one comparison input of the Schmitt trigger is connected to the connecting point of the voltage divider resistors located near a positive terminal of the supply voltage and the other comparison input of the Schmitt trigger is connected to the connecting point of the voltage divider resistors located near a negative terminal of the supply voltage.

11. An electronic switchgear in accordance with claim 3, wherein the control circuit comprises an analog amplifier with a reference input, a control input and a control output and wherein the reference input is connected to a reference voltage, the control input is connected to the demodulator condenser and the control output is connected to the oscillator.

12. An electronic switchgear in accordance with claim 10, wherein the voltage divider has a fourth voltage divider resistor and a further connecting point between the third voltage divider resistor and the fourth voltage divider resistor said voltage divider being connected via the fourth voltage divider resistor to the negative terminal of the supply voltage and wherein the reference input of the analog amplifier of the control circuit is connected to the connecting point between the third voltage diver resistor and the fourth voltage divider resistor.

13. An electronic switchgear in accordance with claim 11, wherein the oscillator has an oscillator transistor with an emitter resistor, and be means of the control circuit a control resistor can be switched in parallel with the emitter resistor of the oscillator transistor.

14. An electronic switchgear in accordance with claim 13, wherein the control circuit has a control transistor with a collector emitter path, the base of the control transistor is connected to the control output of the analog amplifier and wherein the control resistor can be switched in parallel with the emitter resistor of the oscillator transistor by means of the collector emitter path of the control transistor.

15. An electronic switchgear in accordance with claim 13, further comprising a hysteresis resistor and a hysteresis transistor with a collector emitter path, the hysteresis resistor being in series with the emitter resistor of the oscillator transistor, the base of the hysteresis transistor being connected to the signal output of the Schmitt trigger and the collector emitter path of the hysteresis transistor is connected parallel to the hysteresis resistor.

16. An electronic switchgear in accordance with claim 9, further comprising a hysteresis resistor and an hysteresis transistor with a collector emitter path, the hysteresis resistor being in series with the emitter resistor of the oscillator transistor, the base of the hysteresis transistor being connected to the signal output of the Schmitt trigger and the collector emitter path of the hysteresis transistor is connected parallel to the hysteresis resistor.

* * * * *